(12) United States Patent
Kubota et al.

(10) Patent No.: US 6,183,669 B1
(45) Date of Patent: *Feb. 6, 2001

(54) PASTE COMPOSITION, CIRCUIT BOARD USING THE SAME, CERAMIC GREEN SHEET, CERAMIC SUBSTRATE, AND METHOD FOR MANUFACTURING CERAMIC MULTILAYER SUBSTRATE

(75) Inventors: Masahiro Kubota, Shiga-ken; Michiaki Iha, Kusatsu; Shizuharu Watanabe, Omihachiman, all of (JP)

(73) Assignee: Murata Manufacturing Co., Ltd. (JP)

( * ) Notice: Under 35 U.S.C. 154(b), the term of this patent shall be extended for 0 days.

This patent is subject to a terminal disclaimer.

(21) Appl. No.: 09/522,149

(22) Filed: Mar. 9, 2000

(30) Foreign Application Priority Data

Mar. 25, 1999 (JP) .................................... 11-081541
Mar. 25, 1999 (JP) .................................... 11-081543

(51) Int. Cl.[7] ................................ H01B 1/20; C09D 5/24; B05D 5/12
(52) U.S. Cl. ..................... 252/518.1; 252/519.5; 252/520.2; 252/521.4; 106/1.25; 427/97
(58) Field of Search ................ 252/500, 512, 252/513, 514, 518.1, 519.5, 520.2, 521.4; 427/97; 106/1.25, 1.26

(56) References Cited

U.S. PATENT DOCUMENTS 5,914,358 * 6/1999 Kawakita et al. .................. 523/458

FOREIGN PATENT DOCUMENTS

| 06283846 | * | 10/1994 | (JP) . |
| 09092983 | * | 4/1997 | (JP) . |
| 09218508 | * | 8/1997 | (JP) . |
| 09218509 | * | 8/1997 | (JP) . |
| 09222723 | * | 8/1997 | (JP) . |
| 10171107 | * | 6/1998 | (JP) . |
| 10279364 | * | 10/1998 | (JP) . |

* cited by examiner

Primary Examiner—Mark Kopec
(74) Attorney, Agent, or Firm—Ostrolenk, Faber, Gerb & Soffen, LLP (57) ABSTRACT

There is disclosed a paste composition including (A) an organic binder comprising acidic functional groups; (B) an inorganic powder containing multivalent metal compounds; and (C) a mono-ol compound having a boiling point of about 178° C. or more. The paste composition enables various fine patterns such as via-holes with high precision, by suppressing gelation caused by mixing an organic binder having acidic functional groups and a compound containing multivalent metals.

18 Claims, 1 Drawing Sheet

FIG. 1

PASTE COMPOSITION, CIRCUIT BOARD USING THE SAME, CERAMIC GREEN SHEET, CERAMIC SUBSTRATE, AND METHOD FOR MANUFACTURING CERAMIC MULTILAYER SUBSTRATE

BACKGROUND OF THE INVENTION

1. Field of the Invention

The present invention relates to a paste composition having various characteristics, and a circuit board using the same.

Further, the present invention relates to a ceramic green sheet having insulating, dielectric and magnetic properties and a ceramic substrate using the ceramic green sheet, and a method for manufacturing a ceramic multilayer substrate.

2. Description of the Related Art

In order to allow the circuit board integrated into electronic appliances such as mobile terminal devices and computers to exhibit its function, conductor patterns and via-holes should be formed through the substrates. The conductor patterns and via-holes in the circuit board mounted in these electronic appliances should be fine and highly precise, especially in order to comply with the recent requirements for making high frequency electronic devices to be highly integrated and to respond to high speed signals.

The via-holes have been usually formed by printing an insulating paste composition prepared by mixing an insulating inorganic powder such as a glass with an organic vehicle through a given screen mask on the substrate, and filling a conductive paste composition into the holes intended to become the via-holes, followed by firing the substrate. However, a via-hole having a diameter of at best approximately 200 μm can be formed due to blotting and blurring during the screen printing.

Japanese Unexamined Patent Publication No. 6-283846 discloses, on the other hand, a method for forming the fine via-holes by a photolithographic method using a photosensitive paste composition prepared by additionally mixing photosensitive organic components in the insulating paste composition.

Recently, it has been desired that the photosensitive paste composition used in the photolithographic method be able to be developed with water or an aqueous alkaline solution in consideration of the effect on the environment. Therefore, acidic functional groups such as carboxyl groups are introduced into the photosensitive organic binder.

However, when multivalent metal compounds (especially multivalent metal oxides) having a valence of two or more are used as the insulating inorganic powder in the photosensitive organic binder, the multivalent inorganic ions dissolved into the soluble fraction of the photosensitive paste composition react with anions of the photosensitive organic binder, forming three dimensional network of ionic cross-links to develop gelation. Coating of the paste becomes difficult when the photosensitive paste composition is gelled or, even if coating be possible, the development process becomes so unstable that the paste composition is hardly applicable.

For preventing gelation, Japanese Unexamined Patent Publication No. 9-218509, 9-218508 and 9-222723 have disclosed photolithographic methods using photosensitive paste compositions comprising phosphorous containing compounds such as phosphoric acid, compounds having azole structures such as benzotriazole, and organic compounds having carboxyl groups, respectively. However, the time interval before forming a gel of the photosensitive paste composition is merely extended for a while by these methods, and using the photosensitive paste composition comprising an inorganic powder containing multivalent metal compounds such as a glass powder and ceramic powder have been practically difficult.

Japanese Unexamined Patent Publication No. 10-171107 discloses a method for preventing gelation, thus improving preservation stability, by including 3-methyl-3-methoxybutanol in the photosensitive paste composition. However, since 3-methyl-3-methoxybutanol has a boiling point as low as 174° C., the compound is completely evaporated from coating films that have been dried after coating, often decreasing the effect for preventing gelation. It is also a problem that the portions not exposed to the light are hardly dissolved into the development solvent when the photosensitive paste composition using the compound is subjected to a development treatment.

Further, it is effective for making ceramic multilayer substrates represented by substrates for use in high frequency modules and hybrid ICs to be more multifunctional and highly integrated, and to have higher performance, to form a high density wiring while packaging high precision passive members in the ceramic multilayer substrate. For example, Japanese Unexamined Patent Publication No. 9-92983 discloses a method for manufacturing a ceramic multilayer substrate integrating passive members such as inductors and capacitors, wherein the inductors and capacitors are partially formed on the ceramic multilayer substrate using a ceramic green sheet having various characteristics such as an insulating property, a dielectric property and a magnetic property.

Fine via-holes should be formed through the ceramic green sheet having the insulating property, dielectric property and magnetic property, in order to make the ceramic multilayer capacitor to be multifunctional and highly integrated, and to have higher performance. Via-holes have been formed through the ceramic green sheet by punching with a press mold. However, since the ceramic green sheet is processed by impressing a mechanical load, a via-hole having a diameter of at most approximately 100 μm can be formed.

Japanese Unexamined Patent Publication No. 10-279364 discloses, for example, a method for forming finer via-holes using a photolithographic method. This method comprises preparing a photosensitive ceramic green sheet by forming a sheet of a slurry by mixing a photosensitive resin and ceramic powder, and exposing the green sheet with an activation light beam such as UV light through a photo-mask followed by development for forming fine via-holes.

However, the organic polymer compound in organic binders, especially in photosensitive organic binders, has an acidic functional group that liberates protons such as a carboxylic group and hydroxyl group as its side chain. When a powder containing multivalent metals or their oxides such as a glass powder and ceramic powder is mixed with an organic polymer compound having acidic functional groups, ionic cross links among the multivalent metal ions dissolved out of the powder and organic polymer compounds are formed to cause gelation by forming a three dimensional network.

A nonuniform slurry in which gels are formed has a low processing performance, making it difficult to form a sheet as well as via-holes and conductor patterns. Forming a ceramic green sheet using a nonuniform slurry results in a mechanically fragile ceramic substrate due to, for example, cracks generated during firing.

SUMMARY OF THE INVENTION

To overcome the above described problems, preferred embodiments of the present invention provide a paste composition that is able to form various fine and highly precise patterns, including the via-holes, by suppressing gelation caused when an organic binder having acidic functional groups and a multivalent metal compound having a valence of two or more are mixed, and a circuit board using the same.

Further, preferred embodiments of the present invention provide a ceramic green sheet having good dispersing property and processing performance by suppressing gel formation of the slurry prepared by mixing an organic polymer compound having acidic functional groups with a ceramic powder and glass powder containing multivalent metals or their oxides.

Further, preferred embodiments of the present invention provide a mechanically tough ceramic substrate using a ceramic green sheet having a good dispersion ability, or provide a method for manufacturing a highly reliable ceramic multilayer substrate having a highly integrated and fine conductor pattern.

The inventors of the present invention have found, through intensive studies for solving the foregoing problems, that gelation is sufficiently suppressed in the paste or slurry before coating, and in the coated film after coating and drying, by including a mono-ol compound having a boiling point of about 178° C. or more in the paste composition or slurry prepared by mixing an organic binder having acidic functional groups and a multivalent metal compound having a valence of two or more.

One preferred embodiment of the present invention provides a paste composition prepared by mixing: (A) an organic binder comprising acidic functional groups; (B) an inorganic powder containing multivalent metal compounds; and (C) a mono-ol compound having a boiling point of about 178° C. or more.

The above described paste composition may comprise a glass powder and/or ceramic powder.

Preferably, the paste composition according to the present invention contains about 30% or more and less than about 90% by volume of the inorganic powder.

Preferably, the paste composition according to the present invention additionally contains a photosensitive organic component.

Preferably, the mean particle size of the inorganic powder in the paste composition has a mean particle size in the range of about 0.1 to 10 $\mu$m.

The above described paste composition may additionally contain a UV absorbing agent.

Preferably, the organic binder in the paste composition according to the present invention is an acrylic copolymer having carboxylic groups on its side chain.

The paste composition according to the present invention preferably contains at least twice as many moles of the mono-ol compound as the moles of the multivalent metal ions that are dissolved into the soluble fraction of the paste.

Preferably, the paste composition according to the present invention additionally contains organic solvents, the mono-ol compound accounting for about 10 to 92% by weight of the combined content of the mono-ol compound and organic solvents.

Further, there is provided a circuit board comprising a layer formed by firing the above described paste composition.

The paste composition according to the present invention is produced by adding a mono-ol compound having a boiling point of about 178° C. or more into the paste composition prepared by mixing the organic binder having acidic functional groups and inorganic powder containing multivalent metal compounds with a valence of two or more. Therefore, gelation is sufficiently suppressed in the paste before coating, and in the coated film after coating and drying, besides enabling fine and highly precise patterns such as via-holes to be formed.

The circuit board according to the present invention is provided with layers (insulating layer, dielectric layer and the like) formed by firing the paste composition according to the present invention in order to form fine and highly precise patterns, thereby enabling a highly integrated circuit board that complies with the recent requirements of high signal speed to be obtained.

The hydroxyl group (—OH) in the mono-ol compound has a markedly strong binding force with the multivalent metal ions as compared with the acidic functional groups (especially carboxyl groups) in the organic binder. Therefore, the multivalent metal ions dissolved into the soluble fraction of the paste composition preferentially react with the mono-ol compound to prevent ionic cross-links between the anions of the organic binder and multivalent metal ions from forming three dimensional networks. Since the mono-ol compound has only one hydroxyl group, three dimensional networks by the ionic cross links are not formed when the mono-ol compound has reacted with the multivalent metal ions. Moreover, since the mono-ol compound has a boiling point of about 178° C. or more, it remains in the coating film even when the film is dried after coating, thus sufficiently exhibiting gelation preventive function.

The photosensitive paste composition prepared by further adding a photosensitive organic component in the paste composition according to the present invention allows gelation to be sufficiently suppressed in the paste prior to coating as well as in the coating film after drying, enabling a stable development process by the photolithographic method to be applied.

Another preferred embodiment of the present invention provides a ceramic green sheet manufactured by forming a sheet of slurry prepared by mixing: (A) an organic binder comprising acidic functional groups; (B) an inorganic powder containing multivalent metal compounds; and (C) a mono-ol compound having a boiling point of about 178° C. or more.

The ceramic green sheet may contain twice as many moles, or more, of the mono-ol compound as the moles of the multivalent metal ions that are dissolved into the solvent fraction of the slurry.

The content of the mono-ol compound may be about 5 to 95% by weight relative to the total solvent fraction of the slurry.

The ceramic powder and/or glass powder preferably contains at least one of the multivalent ions selected from a group comprising boron, barium, magnesium, aluminum, calcium, lead, bismuth, copper, zinc, zirconium, niobium, chromium, strontium and titanium.

The slurry may further contains a photosensitive organic component.

The ceramic substrate preferably comprises a ceramic layer prepared by firing the ceramic green sheet.

Further, there is provided a method for manufacturing a ceramic multilayer substrate comprising the steps of: forming a via-hole through the above described ceramic green sheet; laminating plural green sheets containing the ceramic green sheet after forming conductor patterns being in electrical continuity with the via-holes; and firing the laminated green sheet.

According to the above arrangement, a ceramic green sheet having good dispersing property and processing performance can be obtained by suppressing gelation of the slurry.

The hydroxyl group in the mono-ol compound has a remarkable binding force to multivalent ions dissolved out of the ceramic powder and glass powder as compared with acidic groups (especially carboxylic groups) of the organic polymer compound in the organic binder. Therefore, a priority is given to the reaction of the mono-ol compound with multivalent metal ions to prevent formation of ionic cross-links and three dimensional networks among the organic polymer compounds and multivalent metal ions. Since the mono-ol compound possesses only one hydroxyl group, the three dimensional network of ionic cross-links is not formed when the mono-ol compound is bound to the multivalent metal ions.

Fine and highly precise via-holes can be formed through the photosensitive ceramic green sheet containing a photosensitive organic component, enabling a ceramic green sheet, being possible to comply with the requirement of making semiconductor patterns to be super-fine, to be obtained.

The above described ceramic substrate is provided with ceramic layers formed by firing the uniform ceramic green sheet according to the present invention having a good processing performance, thereby making it possible to obtain a dense ceramic substrate with high strength.

The above described method for manufacturing the ceramic multilayer substrate using the ceramic green sheet having a good processing performance and dispersing ability allows via-holes and conductor patterns to be finely formed with a high density.

DETAILED DESCRIPTION OF EMBODIMENTS OF THE INVENTION

The paste composition according to the present invention will be described hereinafter in more detail.

Examples of the mono-ol compound having a boiling point of about 178° C. or more include 1-octyl alcohol, 2-octyl alcohol, nonyl alcohol, decyl alcohol, 1-methylcyclohexanol, trimethylcyclohexenol, ethyleneglycol monoacetate, diethylneneglycol monobutyl ether, diethyleneglycol monoethyl ether, diethyleneglycol monohexyl ether, diethyleneglycol monomethyl ether, diethyleneglycol monovinyl ether, dipropyleneglycol monomethyl ether, dipropyleneglycol monoethyl ether, dipropyleneglycol monobutyl ether, ethyleneglycol isoamyl ether, ethyleneglycol phenyl ether, ethyleneglycol benzyl ether, trimethyl hexanol, tetrahydrofurfuryl alcohol, cresol, butyl lactate, benzyl alcohol, hydroxyethyl acrylate, phenethyl alcohol, mercaptoethanol, hydroxyethyl methacrylate, hydroxyethyl piperazine, cyclohexanone oxime, hydroxymethoxy allylbenzene, hydroxymethoxy benzaldehyde, hydroxymethyl piperazine, hydroxypropionitrile, hydroxyacetonaphthone, hydroxybenzaldehyde, hydroxyacetophenone, hydroxybenzoimidazole, phenylphenol, hydroxybenzoic acid, hydroxybenzophenone, bezoin, thymol, hydroxymethoxy benzoic acid, hydroxymethyl benzoic acid, hydroxymethylpyrone, hydroxynaphthoic acid, hydroxynaphthoquinone, hydroxynorbornene dicarboximide, hydroxyphenyl acetic acid, hydroxyphenyl glycine, hydroxyphthalimide, hydroxypivalic acid neopentylglycol ester, hydroxyphthalimide, hydroxypivalic acid neopentylglycol ester, hydroxypropyophenone, hydroxystearic acid, hydroxysuccimide, hydroxytoluylic acid, and pentaerythritol diacrylate monostearate and a mixture thereof.

The inorganic powder may be a glass powder and/or ceramic powder in the paste composition according to the present invention. Glass powders known in the art such as a borosilicate glass powder may be used for the glass powder while a crystalline glass, composite glass and non-glass powders may be used for the ceramic powder. An insulating paste composition is prepared by using an insulating inorganic powder, and a resistive paste composition is prepared by using a high resistance inorganic powder for the inorganic powder in the paste composition according to the present invention.

Examples of the glass powders containing multivalent metal oxides having a valence of two or more include $SiO_2$—$PbO$, $SiO_2$—$ZnO$, $SiO_2$—$Bi_2O_3$, $SiO_2$—$K_2O$, $SiO_2$—$Na_2O$, $SiO_2$—$PbO$—$B_2O_3$, $SiO_2$—$ZnO$—$B_2O_3$, $SiO_2$—$Bi_2O_3$—$B_2O_3$, $SiO_2$—$K_2O$—$B_2O_3$ and $SiO_2$—$Na_2O$—$B_2O_3$ based glasses.

The ceramic powder may contain multivalent metal compounds having a valence of two or more, such as oxides, borates, nitrides and silicates of at least one multivalent metals selected from the group comprising Al, Ba, Ti, Pb, Zr, Mn, Co, Ni, Fe, Y, Nb and Ru. Examples of the metal compounds include insulating ceramic powders such as $Al_2O_3$, dielectric ceramic powders such as $BaTiO_3$, ferrite powders such as nickel-zinc ferrite, nickel-zinc ferrite and nickel-zinc-copper ferrite, high resistance ceramic powders such as $Ru_2O$, $Pb_2Ru_2O_7$, $Bi_2Ru_2O_7$, composite oxides of Mn/Co/Ni, and piezoelectric ceramic powders such as PZT.

It is desirable that the volume ratio of the inorganic powders in the paste composition according to the present invention is in the range of about 30 to 90% for improving sintering property of the paste composition. When the volume ratio is less than about 30%, the volume vigorously contracts by firing, often causing breakdown of wiring after forming a wiring pattern.

When the volume ratio exceeds about 90%, on the other hand, structural strength of the composition becomes so weak that the structure is often collapses during firing. The volume ratio of the inorganic powder refers to the ratio by volume of the inorganic powder remaining after firing relative to the volume of the paste composition.

An photosensitive organic component is preferably contained in the paste composition according to the present invention. In other words, the photosensitive paste composition is formulated by including the photosensitive organic component in the paste composition.

Gelation of the paste composition is sufficiently suppressed in either the paste before coating or in the coating film after coating and drying, since the photosensitive paste composition according to the present invention contains a mono-ol compound having a boiling point of about 178° C. or more, thereby improving its stability while stabilizing the development process in the photolithographic method.

The photosensitive organic components refer to photopolymerizable or photo-modification compounds comprising, for example, (1) a mixture of a monomer and an oligomer having reactive functional groups such as unsaturated groups, and a photo-radical generator such as aromatic carboneyl compounds, (2) a so-called diazo compound such as a condensation compound of an aromatic bis-azide and formaldehyde, (3) a mixture of an addition polymerization compound such as epoxy compounds and photo-acid generator such as diallyliodonium salts, and (4) a naphthoquinone diazide based compound. A mixture of the monomer and oligomer having reactive functional groups such as unsaturated groups, and the photo-radical generator such as aromatic carbonyl compounds is especially preferable among them.

Examples of the monomer and oligomer containing the reactive functional group include hexanediol triacrylate, tripropyleneglycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated phenol acrylate, 1,3-butanediol diacrylate, 1,4-butanediol diacrylate, 1,9-nonanediol diacrylate, diethyleneglycol diacrylate, tetraethyleneglycol diacrylate, triethyleneglycol diacrylate, ethoxylated bisphenol A diacrylate, propoxylated neopentylglycol diacrylate, tris (2-hydroxyethyl) isocyanurate triacrylate, ethoxylated trimthylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritol hydroxypentaacrylate, ethoxylated pentaerythritol tetraacrylate, tetrahydrofurfuryl methacrylate, cyclohexyl methacrylate, isodecyl methacrylate, lauryl methacrylate, triethyleneglycol dimethacrylate, tetraethyleneglycol dimethacrylate, 1,4-butanediol dimethacrylate, diethyleneglycol dimethacrylate, 1,6-hexanediol dimethacrylate, neopentylglycol dimethacrylate, 1,3-butyleneglycol dimethacrylate, ethoxylated bisphenol A dimethacrylate, trimethylolpropane trimethacrylate, isocyanuric acid EO-modified diacrylate, ethoxylated paracumylphenol acrylate, ethylhexyl carbitol acrylate, N-vinyl-2-pyrrolidone, isobornyl acrylate, polypropyleneglycol diacrylate, polyethylneglycol diacrylate, dipentaerythritol pentaacrylate, and dipentaerythritol hexaacrylate.

Examples of the photo-radical generator include benzyl, benzoin ethyl ether, benzoin isobutyl ether, benzoin isopropyl ether, benzophenone, benzoylbezoic acid, methyl benzoylbezoate, 4-benzoyl-4-methyl diphenylsulfide, benzyldimethyl ketal, 2-n-butoxy-4-dimethylamino benzoate, 2-chlorothioxanthone, 2,4-diethyl thioxanthone, 2,4-diisopropyl thioxanthone, isopropyl thioxanthone, 2-dimethylaminoethyl benzoate, ethyl p-dimethylaminobenzoate, isoamyl p-dimethylaminobenzoate, 3,3'-dimethyl-4-methoxy benzophenone, 2,4-dimethyl thioxanthone, 1-(4-dodecylphenyl)-2-hydroxy-2-methyl propane-one, 2,2-climethoxy-1,2-diphenylethane-1-one, hydroxycyclohexylphenyl ketone, 2-hydroxy-2-methyl-1-phenylpropane-1-one, 1-[4-(hydroxyethoxy)-phenyl]-2-hydroxy-2-methyl-1-propane-1-one, 2-methyl-1-[4-(methylthio)phenyl]-2-morpholinopropane-1-one, methylbenzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethylbenzoyl) phenylphosphine oxide.

The mean grain size ($D_{50}$) of the inorganic powder in the photosensitive paste composition according to the present invention is desirably in the range of about 0.1 to 10 $\mu$m in order to suppress luminous energy required for exposure and to effect development process. A mean particle size of less than about 0.1 $\mu$m tends to increase required luminous energy for exposure due to decreased sensitivity while, when the mean particles size exceeds about 10 $\mu$m, decrease of definition may occur during development ascribed to coarse particles.

It is preferable that the photosensitive paste composition according to the present invention contains a UV absorbing agent. The UV absorbing agent contained in the paste composition improves exposure light absorbing efficiency while suppressing insufficient exposure due to light scattering to minimum level. Examples of the UV absorbing agent include azo based red pigments and amine based red dyes.

It is desirable that the organic binder in the paste composition according to the present invention is an acrylic polymer having carboxyl groups on its side chain. Such organic binder is also useful for the photosensitive organic binder, facilitating development procedure in an alkaline or aqueous development solution.

Three dimensional networks by the ionic cross links are readily formed when the organic binder comprises an acrylic copolymer having carboxyl groups on its side chain and the inorganic powder comprises a glass powder and ceramic powder. Formation of the ionic cross links and three dimensional networks is quite effectively suppressed by adding the mono-ol compound with a boiling point of about 178° C. or more in these system.

The organic binder comprising the acrylic copolymer having carboxylic groups on its side chain is produced, for example, by copolymerization of an unsaturated carboxylic acid and ethylenic unsaturated compound. Examples of the unsaturated carboxylic acid include acrylic acid, methacrylic acid, maleic acid, fumaric acid and vinyl acetic acid, and precursors such as the anhydrides thereof. Examples of the ethylenic unsaturated compound include acrylic acid esters such as methyl acrylate and ethyl acrylate, methacrylic acid esters such as methyl methacrylate and ethyl methacrylate, and fumaric acid esters such as monoethyl fumarate. The following compounds in which unsaturation bonds are present may be used for the acrylic copolymers:

(1) A compound in which an acrylic monomer having a functional group reactive to an carboxyl group is attached to the carboxyl group of the acrylic copolymer.

(2) A compound in which a saturated or unsaturated polyfunctional carboxylic acid anhydride is further introduced into the acrylic copolymer prepared by introducing an epoxy group in place of the side chain carboxylic group after allowing the acrylic copolymer to react with the unsaturated carboxylic acid.

It is desirable that the paste composition according to the present invention contains twice the moles, or more, of the mono-ol compound as the moles of the multivalent metal ions that are dissolved into the solvent fraction of the paste. When the content is less than twice as much moles, gelation can be hardly prevented. The molar concentration of the dissolved multivalent metal ion is measured by a method known in the art such as an atomic absorption method, ICP and ICP MS after separating solid fractions of the slurry from the solution by a centrifugal method or filtration method.

The paste composition contains an organic solvent. It is desirable that the content of the mono-ol compound is about 10 to 92% by weight relative to the total amount of the mono-ol compound and organic solvents. Gelation can be hardly suppressed when the content is less than 10% by weight. When the content is more than about 92% by weight, on the other hand, viscosity of the slurry is so extremely decreased that coating performance may be deteriorated.

A preservation stabilizing agent such as a polymerization inhibiting agent, an anti-oxidant, dyes, pigments, an anti-foaming agent and a detergent may be appropriately added, if necessary, into the paste composition according to the present invention.

The circuit board according to the present invention will be described hereinafter in more detail.

Fine patterns with a dimension of 50 μm or less and via-holes with a diameter of 50 μm or less that could not be obtained by the conventional screen printing method can be formed by coating the paste composition according to the present invention (especially a photosensitive paste composition) on the substrate by screen printing or spin coating, followed by drying, exposure and development. The coating film can be dried at 40 to 100° C. for 10 minutes to 2 hours.

Circuit boards and circuit elements may be also manufactured by forming very fine structures such as elements and via-holes on the ceramic green sheet, followed by a heat treatment such as firing, using the paste composition according to the present invention. The method may comprise forming very fine structures on a supporting member such as a polyethyleneterephthalate (PET) using the paste composition according to the present invention, followed by heat-transfer on a ceramic green sheet; or the fine structure may be formed by a photolithographic method after directly coating the paste composition according to the present invention on the ceramic green sheet.

Examples of the ceramic green sheet comprises a sheet of the slurry prepared by mixing a ceramic powder and an organic vehicle. A glass powder may be also added. Otherwise, a structure such as very fine via-holes may be formed by the photolithographic method using a photosensitive green sheet prepared by mixing an organic vehicle with the photosensitive organic component.

The multilayer circuit board or multilayer circuit element can be also manufactured by laminating a plurality of ceramic green sheets on which fine structures have been formed and applying a heat treatment such as simultaneous firing. Also, the multilayer circuit board or multilayer circuit element may be manufactured by forming a laminated structure by coating a mixture containing a functional organic binder after forming very fine structures on the substrate or supporting member using the paste composition according to the present invention, followed by applying a heat treatment such as firing. A mixture containing the ceramic powder and organic binder, a mixture containing conductive metals such as copper and silver and the organic binder, or a mixture further containing a glass powder may be used for the mixture containing the functional organic binder.

The circuit board according to the present invention may comprise substrates for circuit elements such as chip capacitors and chip LCs, and module substrates such as CVO (Voltage Controlled Oscillator) and PLL (Phase Locked Loop).

Since using the photosensitive paste composition according to the present invention allows a stable development procedure to be applied, fine and precise via-holes and patterns necessary for electronic circuits can be formed, allowing a small size circuit board or circuit element having excellent high frequency characteristics to be manufactured. Accordingly, high frequency chip electronic members such as chip inductors and chip lamination capacitors can well comply with the requirement of high integration and high speed signals, also making it possible to manufacture small size and high performance high frequency electronic members.

Further, the ceramic green sheet according to the present invention will be described hereinafter in more detail.

Arbitrary compounds having only one hydroxyl group (OH group) may be used for the mono-ol compound in the ceramic green sheet according to the present invention. The configuration of the mono-ol compound may be either a liquid or a powder.

It is preferable that the ceramic green sheet contains twice as many moles, or more, of the mono-ol compound as the moles of the multivalent metal ions that are dissolved into the solvent fraction of the slurry. Gelation can not be sufficiently prevented when the content is less than twice as much moles. The molar concentration of the dissolved multivalent metal ion is measured by a method known in the art such as an atomic absorption method, ICP and ICP MS after separating solid fractions of the slurry from the solution by a centrifugal method or filtration method.

It is desirable that the content of the mono-ol compound is about 5 to 95% by weight relative to the total amount of the solution fraction in the slurry. Gelation can be hardly suppressed when the content is less than about 5% by weight. When the content is more than about 95% by weight, on the other hand, viscosity of the slurry is so extremely decreased that processing performance may be deteriorated.

It is desirable in the ceramic greens sheet according to the present invention that the ceramic powder and/or the glass powder is a powder containing at least one of the multivalent metals selected from boron, barium, magnesium, aluminum, calcium, lead, bismuth, copper, zinc, zirconium, niobium, chromium, strontium and titanium.

Examples of the powders to be used in the present invention include various powders such as $SiO_2$—$PbO$, $SiO_2$—$ZnO$, $SiO_2$—$Bi_2O_3$, $SiO_2$—$K_2O$, $SiO_2$—$Na_2O$, $SiO_2$—$PbO$—$B_2O_3$, $SiO_2$—$ZnO$—$B_2O_3$, $SiO_2$—$Bi_2O_3$—$B_2O_3$, $SiO_2$—$K_2O$—$B_2O_3$ and $SiO_2$—$Na_2O$—$B_2O_3$ based powders.

When the multivalent ion such as B, Ba, Mg, Al, Ca, Pb, Bi, Cu, Zn, Zr, Nb, Cr, Sr or Ti is dissolved into the slurry, anions of the organic polymer compound having functional groups such as a carboxylic group react with the multivalent metal ion to form ionic cross-links and readily cause gelation. When a mono-ol compound is contained in the slurry, on the other hand, gelation can be effectively prevented.

It is desirable that the slurry for the ceramic green sheet contains a crystalline glass powder or a glass-ceramic powder. Sintering the ceramic green sheet at a low temperature allows a conductor layer comprising a low melting point metal such as silver and copper to be simultaneously sintered.

The green sheets may have various characteristics such as (1) an insulating ceramic green sheet comprising a sheet of the slurry obtained by mixing an insulating ceramic powder, an organic binder and an inorganic powder such as a glass powder, (2) a magnetic ceramic green sheet comprising a sheet of the slurry obtained by mixing a magnetic ceramic powder, an organic binder and an inorganic powder such as a glass powder, and (3) a dielectric ceramic green sheet comprising a sheet of the slurry obtained by mixing a dielectric ceramic powder, an organic binder and an inorganic powder such as a glass powder. The ceramic powder available comprises ceramic materials for the conventional ceramic green sheet.

The organic binder refers to a binder containing an organic polymer compound having functional groups, in which other components such as an organic polymer and organic solvent may be contained. Polymers such as polyvinyl alcohol, polyvinyl butyral, a polymer of methacrylic acid ester and a copolymer of acrylic acid ester and methacrylic acid ester may be used for the organic polymer.

The ceramic green sheet according to the present invention may contain a photosensitive organic component in the slurry. By this arrangement, a photosensitive ceramic green sheet can be formed. According to the photosensitive ceramic green sheet, a ceramic green sheet having an excellent dispersing property and processing performance is obtained by suppressing gelation of the slurry, thereby enabling fine and highly precise via-holes to be readily formed through the ceramic green sheet by photolithography.

The organic polymer compound having acidic functional groups may be an acrylic copolymer having carboxylic groups as its side chain when the ceramic green sheet according to the present invention comprises a photosensitive green sheet. This acrylic copolymer can be produced, for example, by a copolymerization of an unsaturated carboxylic acid and ethylenic unsaturated compound. Since this acrylic copolymer has the carboxylic group as a side chain, organic components in the ceramic green sheet after exposure are readily dissolved in the development solution, thereby enhancing development ability of the photosensitive ceramic green sheet to enable finer via-holes to be formed.

Examples of the unsaturated carboxylic acid include acrylic acid, methacrylic acid, maleic acid, fumaric acid and vinyl acetic acid. Anhydrides thereof can also be used. Examples of the ethylenic unsaturated compounds include, on the other hand, acrylic acid esters such as methyl acrylate and ethyl acrylate, methacrylic acid esters such as methyl methacrylate and ethyl methacrylate, and fumaric acid esters such as monoethyl fumarate. Unsaturated bonds of the type as described below may be introduced into the acrylic copolymer:

(1) An acrylic monomer having a functional group reactive to the acrylic copolymer such as an epoxy group is added to the side chain carboxyl group of the acrylic copolymer.

(2) An unsaturated monocarboxylic acid is allowed to react with the acrylic copolymer in which an epoxy group is introduced in place of the side chain carboxylic acid, followed by additionally introducing a saturated or unsaturated polyfunctional carboxylic acid anhydride.

Fine holes for via-holes can be formed through the photosensitive ceramic green sheet supplemented with the photosensitive organic component by irradiating (exposing) an activation light beam such as a UV light, electron beam and X-ray via a photo-mask, followed by dissolving unexposed portions (development) with an alkaline development solution such as an aqueous solution of sodium carbonate. Via-holes are formed by filling the holes for the via-hole with a conductive material.

A preservation stabilizing agent such as a polymerization inhibiting agent, an anti-oxidant, dyes, pigments, an anti-foaming agent, a detergent and a plasticizer may be appropriately added, if necessary, into the slurry for forming the ceramic green sheet.

Figure 1:
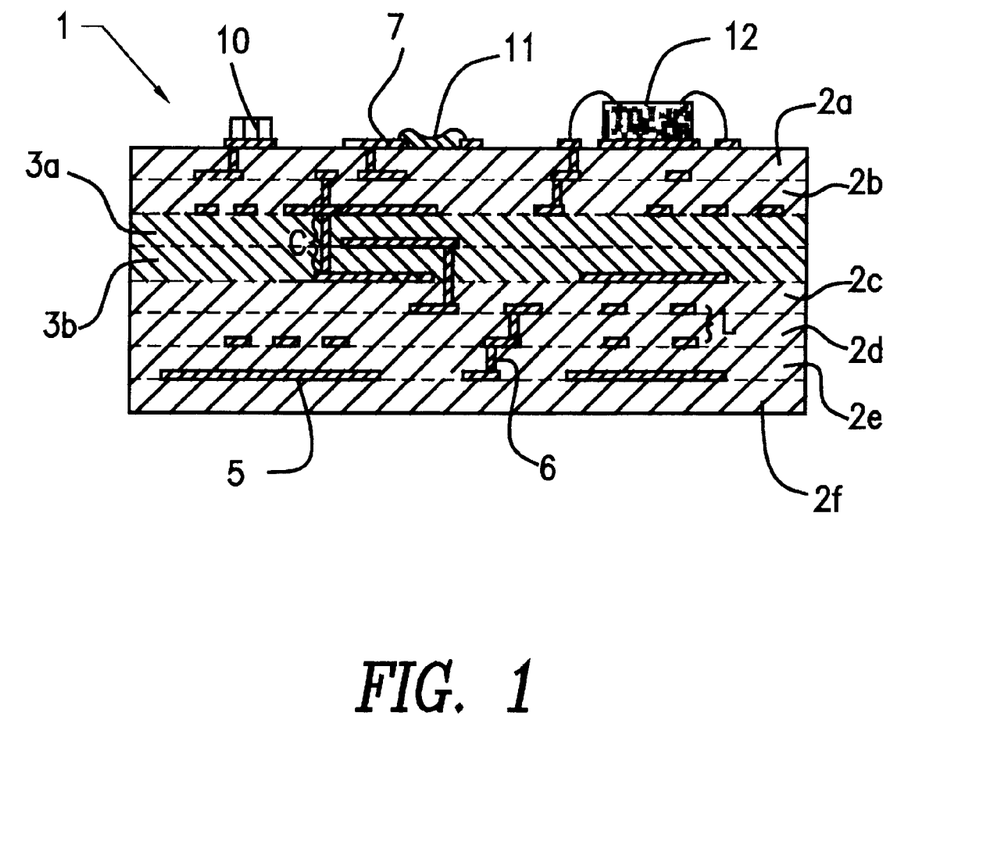
FIG. 1 is an illustrative drawing of the ceramic multilayer substrate according to the present invention.

The method for manufacturing the ceramic substrate and ceramic multilayer substrate according to the present invention will be described hereinafter with reference to FIG. 1.

The ceramic multilayer substrate 1 comprises a multilayer wiring board formed by laminating insulator layers 2a, 2b, 2c, 2d, 2e and 2f, and dielectric layers 3a and 3b. Capacitor patterns C, coil patterns L and strip lines are formed in the ceramic multilayer substrate 1 using inner electrodes 5 and via-holes 6. Tip members 10 such as tip capacitors, thick film resistors 11 and semiconductor IC 12 are provided on one principal face of the ceramic multilayer substrate 1, each of which is electrically connected to surface conductors 7 and inner electrodes 5.

The ceramic multilayer substrate 1 is manufactured, for example, by the following procedure.

A slurry for the insulation ceramic green sheet endowed with photosensitivity is prepared by mixing the glass powder or ceramic powder, photosensitive organic binder containing the organic binder having the acidic functional groups and the mono-ol compound. Also, a slurry for the dielectric ceramic green sheet endowed with photosensitivity is prepared by the similar method as described above.

A sheet is formed from each slurry obtained by the doctor blade method. The photosensitive insulating ceramic green sheet and photosensitive dielectric ceramic green sheet are prepared by drying the sheets at 50 to 250° C. Then, capacitor patterns and coil patterns are formed on each ceramic green sheet obtained.

Via-holes are formed through each green sheet depending on requirements. These via-holes are formed by the steps comprising, exposing the holes for the via-holes with a diameter of, for example, 50 $\mu$m via a photo-mask, forming the holes for the via-holes by removing unnecessary portions by applying a development treatment with an aqueous alkaline solution, and filling a conductive material into the holes for the via-holes.

The ceramic green sheets on which the conductor patterns and via-holes are formed are piled and pressed, followed by firing at a prescribed temperature. The ceramic multilayer substrate is manufactured by mounting the tip members 10 and semiconductor IC 12 after additionally forming surface conductors.

In the method for manufacturing the ceramic multilayer substrate, the insulator layers 2a, 2b, 2c, 2d, 2e and 2f are formed using the photosensitive insulating ceramic green sheet according to the present invention. Therefore, the ceramic green sheet having the fine via-holes is readily manufactured with a good processing performance. Likewise, the ceramic green sheet having the fine via-holes is readily manufactured with a good processing performance since the insulator layers 3a and 3b are made of the photosensitive insulating ceramic green sheet according to the present invention.

In other words, the photosensitive ceramic green sheet according to the present invention has small time-dependent viscosity change due to gelation and excellent processing performance. Therefore, very fine via-holes with a diameter of less than 150 $\mu$m, especially less than 50 $\mu$m, are formed with high precision by suppressing printing blots ascribed to deteriorated viscosity. Moreover, since the components constituting the slurry are uniformly dispersed, a fine and tough ceramic substrate (especially a multilayer ceramic substrate) having excellent substrate characteristics after firing can be obtained.

While the photosensitive ceramic green sheet according to the present invention was used in the foregoing manufacturing method for forming the insulator layers 2a, 2b, 2c, 2d, 2e and 2f, and the dielectric layers 3a and 3b, either the insulating layer or the dielectric layer may be formed of the photosensitive ceramic green sheet, along with forming the other layer with a ceramic green sheet having no photosensitivity. It is also possible to construct an inductor having a high inductance by forming the magnetic ceramic green sheet into a coil pattern.

The ceramic substrate according to the present invention is not limited to the ceramic multilayer substrate 1 as described above, but the ceramic substrate can be also applied for the ceramic multilayer substrate for use in electronic members that is use for forming high frequency circuits such as a tip capacitor and tip LC filter, as well as for the ceramic multilayer substrate for use in high frequency modules such as a CVO (Voltage Controlled Oscillator) and PLL (Phase Locked Loop) and ceramic elements such as a piezoelectric element.

The present invention will be described hereinafter with reference to examples.

EXAMPLE 1
(photosensitive paste composition)

After mixing each component having the following composition and blending amount, the mixture was kneaded with a three-roll mill to prepare the photosensitive paste composition.

[Organic binder]

A copolymer with a copolymerization weight ratio of methacrylic acid/methyl methacrylate of 25/75: 2.0 g.

[Inorganic powder]

$SiO_2$—$K_2O$—$B_2O_3$ based glass powder (containing 17% of boric acid): 5.0 g.

[Monomer containing reactive functional group]

Trimethylolpropane triacrylate: 1.0 g.

[Photo-polymerization initiator]

2-methyl-1-[4-(methylthio)phenyl]-2-morpholinopropane-1-one: 0.4 g 2,4-diethylthioxanthone: 0.1 g.

[Organic solvent]

Ethylcarbitol acetate: 4.0 g.

[Mono-ol compound]

Dipropyleneglycol monomethyl ether (boiling point 189 to 190° C.): 1.0 g.

[UV absorbing agent]

Azo red dye: 0.1 g.

The photosensitive paste composition in this example was coated on an alumina insulating substrate using a spin coater and the coated substrate was dried at 100° C. for 1 hour to obtain a coating film with a thickness of 20 $\mu$m. After allowing the coating film to stand for 24 hours, the film was exposed to a high-pressure mercury lamp at a luminous energy of 250 mJ/cm$^2$ through a mask on which a pattern with a line/space (L/S) ratio of 20/20 ($\mu$m) was printed. Then, the exposed pattern was developed with an aqueous solution of sodium carbonate to form a pattern with a L/S ratio of 20/20 ($\mu$m). The substrate was fired at 850° C. in the air to obtain an insulating pattern with a L/S ratio of 20/20 ($\mu$m).

Preservation states of the photosensitive paste composition were observed immediately after the preparation, and 1 day, three days, one week and one month after the preparation at a temperature of 20° C. in the air. The photosensitive paste in this example showed no gelation at any time described above. In other words, spin-coating of the composition on the insulating substrate and forming a pattern by the photolithographic method were possible immediately after the preparation, and even at 1 day, three days, one week and one month after the preparation.

EXAMPLE 2
(photosensitive paste composition)

A photosensitive paste composition was prepared by the same method as in Example 1, except that 2-octyl alcohol (melting point 178 to 179° C.) was used in place of diethyleneglycol monomethyl ether.

EXAMPLE 3
(photosensitive paste composition)

A photosensitive paste composition was prepared by the same method as in Example 1, except that butyl lactate (melting point 185 to 187° C.) was used in place of diethyleneglycol monomethyl ether.

EXAMPLE 4
(photosensitive paste composition)

A photosensitive paste composition was prepared by the same method as in Example 1, except that 3-methoxy-3-methyl butanol (melting point 173 to 175° C.) was used in place of diethyleneglycol monomethyl ether.

EXAMPLE 5
(photosensitive paste composition)

A photosensitive paste composition was prepared by the same method as in Example 1, except that 4-methylcyclohaxanol (melting point 172 to 175° C.) was used in place of diethyleneglycol monomethyl ether.

EXAMPLE 6
(photosensitive paste composition)

A photosensitive paste composition was prepared by the same method as in Example 1, except that 1-heptyl alcohol (melting point 176° C.) was used in place of diethyleneglycol monomethyl ether.

Patterns with a L/S ratio of 20/20 ($\mu$m) were formed by the same method as in Example 1 using the photosensitive paste compositions in Examples 2 to 6. Stability for the development procedure was also evaluated with respect to the photosensitive paste compositions in Examples 1 to 6. The results of evaluations are listed in TABLE 1. The mark "◯" in TABLE 1 denotes that a good pattern could be formed by allowing non-exposed portions to dissolve into the development solution. The mark "Δ" in TABLE 1 denotes that, although the non-exposed portions are partly dissolved into the development solution, patterns could not be sufficiently formed, while the mark "x" denotes that patterns could not be formed at all since non-exposed portions were not dissolved into the development solution.

TABLE 1

| EXAMPLE | MONO-OL COMPOUND | BOILING POINT | RESULT |
|---|---|---|---|
| 1 | diproplene glycol monomethyl ether | 189–190° C. | ◯ |
| 2 | 2-octyl alcohol | 178–179° C. | ◯ |
| 3 | butyl lactate | 185–187° C. | ◯ |
| 4 | 3-methoxy-3-methyl butanol | 173–175° C. | x |
| 5 | 4-methylcyclohexanol | 172–175° C. | x |
| 6 | 1-heptyl alcohol | 176° C. | Δ |

TABLE 1 shows that insulating patterns with good configurations could be formed using the photosensitive paste compositions in Examples 1 to 3 since non-exposed portions were readily dissolved into the development solution.

To the contrary, patterns could not be formed when the mono-ol compounds has a boiling point of less than about 178° C. because non-exposed portions were not dissolved into the development solution. This is probably because the mono-ol compounds had evaporated off from the coating films during the drying step after coating the photosensitive paste compositions, thereby deteriorating gelation preventing ability with time lapse.

EXAMPLE 7
(photosensitive paste composition)

A photosensitive paste composition was prepared by the same method as in Example 1, except that dipropyleneglycol monomethyl ether was not added.

EXAMPLE 8
(photosensitive paste composition)

A photosensitive paste composition was prepared by the same method as in Example 1, except that 0.1 g of phosphoric acid was added in place of dipropylcneglycol monomethyl ether.

EXAMPLE 9
(photosensitive paste composition)

A photosensitive paste composition was prepared by the same method as in Example 1, except that 0.2 g of benzo-triazole was added in place of 1.0 g of dipropyleneglycol monomethyl ether.

EXAMPLE 10
(photosensitive paste composition)

A photosensitive paste composition was prepared by the same method as in Example 1, except that 1.0 g of acetic acid was added in place of 1.0 g of dipropyleneglycol monomethyl ether.

Stabilities on preservation of the photosensitive paste compositions in Examples 7 to 10 were evaluated. The photosensitive paste compositions were preserved at 20° C. in air. The results of evaluation are shown in TABLE 2 below together with the results of evaluation of the photosensitive paste in Example 1. The mark "○" denotes that the paste was not gelled and coating was possible. The mark "x" denotes that the paste had gelled and coating was impossible.

TABLE 2

| EX-AM-PLE | ADDITIVE | IMMEDI-ATELY AFTER | 1 DAY AFTER | 3 DAYS AFTER | 1 WEEK AFTER | 1 MONTH AFTER |
|---|---|---|---|---|---|---|
| 1 | dipropylene glycol monomethyl ether | ○ | ○ | ○ | ○ | ○ |
| 7 | none | ○ | x | x | x | x |
| 8 | phosphoric acid | ○ | x | x | x | x |
| 9 | benzotriazole | ○ | x | x | x | x |
| 10 | acetic acid | ○ | x | x | x | x |

TABLE 2 shows that, while stabilities of the photosensitive paste not containing the mono-ol compounds at all and the photosensitive paste containing a gelation preventive agent were good and gelation was prevented immediately after preparation, gelation had initiated after time lapse.

EXAMPLE 11
(photosensitive paste composition)

After mixing each component having the following compositions and blending amounts, the mixture was kneaded with a three-roll mill to prepare a photosensitive paste composition.

[Organic binder]
A copolymer with a copolymerization weight ratio of methacrylic acid/methyl methacrylate of 25/75 (weight average molecular weight=50,000): 2.0 g.
[Inorganic powder]
Nickel-zinc ferrite: 5.0 g.
[Monomer containing reactive functional group]
Trimethylolpropane triacrylate: 1.0 g.
[Photo-polymerization initiator]
2-methyl-1-[4-(methylthio)phenyl]-2-morpholinopropane-1-one: 0.4 g 2,4-diethylthioxanthone: 0.1 g.
[Organic solvent]
Ethylcarbitol acetate: 4.0 g.
[Mono-ol compound]
Dipropyleneglycol monomethyl ether (boiling point 189 to 190° C.): 1.0 g.
[UV absorbing agent]
Azo red dye: 0.1 g.

Then, the photosensitive paste composition in this example was coated on an alumina insulating substrate by spin coating and dried at 100° C. for 1 hour to form a coating film with a thickness of 20 μm. After allowing the coating film obtained to stand for 24 hours, the film was exposed to a high-pressure mercury lamp at a luminous energy of 250 mJ/cm² through a mask on which via-holes with a diameter of 20 μm was printed. The holes for the via-holes with a diameter of 20 μm were formed by development with an aqueous sodium carbonate solution. Via-holes with a diameter of 30 μm was formed by firing at 950° C. in the air after filling the holes for the via-holes with a conductive paste composition.

Preservation states of the photosensitive paste composition were observed immediately after the coating, and 1 day, three days, one week and one month after the preparation at a temperature of 20° C. in the air. The photosensitive paste in this example showed no gelation at any time described above. In other words, spin-coating of the composition on the insulating substrate and forming the via-holes by the photolithographic method were possible immediately after the preparation, and even at 1 day, three days, one week and one month after the preparation.

EXAMPLE 12
(photosensitive paste composition)

A photosensitive paste composition was prepared by the same method as in Example 11, except that octyl alcohol (boiling point 178 to 179° C.) was used in place of dipropyleneglycol monomethyl ether.

EXAMPLE 13
(photosensitive paste composition)

A photosensitive paste composition was prepared by the same method as in Example 11, except that butyl lactate (boiling point 185 to 187° C.) was used in place of dipropyleneglycol monomethyl ether.

EXAMPLE 14
(photosensitive paste composition)

A photosensitive paste composition was prepared by the same method as in Example 11, except that 3-methoxy-3-methylbutanol (boiling point 173 to 175° C.) was used in place of dipropyleneglycol monomethyl ether.

EXAMPLE 15
(photosensitive paste composition)

A photosensitive paste composition was prepared by the same method as in Example 11, except that 4-methylcyclohexanol (boiling point 172 to 175° C.) was used in place of dipropyleneglycol monomethyl ether.

EXAMPLE 16
(photosensitive paste composition)

A photosensitive paste composition was prepared by the same method as in Example 11, except that 1-heptyl alcohol (boiling point 176° C.) was used in place of dipropyleneglycol monomethyl ether.

Holes for via-holes with a diameter of 20 μm were formed by the same method as in Example 11 using the photosensitive paste compositions in Examples 12 to 16. Stabilities during development process were evaluated when the holes for the via-holes were formed using the photosensitive paste compositions in Examples 12 to 16. The results of evaluation are shown in TABLE 3 below. The mark "○" in TABLE 3 denotes that a good via-holes could be formed by allowing non-exposed portions to dissolve into the development solution. The mark "Δ" in TABLE 3 denotes that, although the non-exposed portions are partly dissolved into the development solution, sufficient via-holes could not be formed, while the mark "x" denotes that the via-holes could not be formed at all since non-exposed portions were not dissolved into the development solution.

TABLE 3

| EXAMPLE | MONO-OL COMPOUND | BOILING POINT | RESULT |
| --- | --- | --- | --- |
| 11 | dipropylene glycol monomethyl ether | 189–190° C. | ○ |
| 12 | 2-octyl alcohol | 178–179° C. | ○ |
| 13 | butyl lactate | 185–187° C. | ○ |
| 14 | 3-methoxy-3-methyl butanol | 173–175° C. | x |
| 15 | 4-methylcyclohexanol | 172–175° C. | x |
| 16 | 1-heptyl alcohol | 176° C. | Δ |

TABLE 3 shows that the photosensitive paste compositions in Examples 11 to 13 containing the mono-ol compounds with a boiling point of about 178° C. or more were able to from the via-holes with good configuration since the non-exposed portions had been readily dissolved into the development solution.

When the mono-ol compounds with a boiling point of less than about 178° C. as in Examples 14 to 16 were used, the mono-ol compounds had been evaporated off from the coating films in the drying step after coating the photosensitive paste compositions, and gelation preventive ability was deteriorated with time lapse.

EXAMPLE 17
(photosensitive paste composition)

A photosensitive paste composition was prepared by the same method as in Example 11, except that dipropyleneglycol monomethyl ether was not added at all.

EXAMPLE 18
(photosensitive paste composition)

A photosensitive paste composition was prepared by the same method as in Example 11, except that 0.1 g of phosphoric acid was added in place of 1.0 g of dipropyleneglycol monomethyl ether.

EXAMPLE 19
(photosensitive paste composition)

A photosensitive paste composition was prepared by the same method as in Example 11, except that 0.02 g of benzotriazole was added in place of 1.0 g of dipropyleneglycol monomethyl ether.

EXAMPLE 20
(photosensitive paste composition)

A photosensitive paste composition was prepared by the same method as in Example 11, except that 1.0 g of acetic acid was added in place of 1.0 g of dipropyleneglycol monomethyl ether.

Preservation stabilities of the photosensitive paste compositions in Examples 17 to 20 were evaluated. the photosensitive paste compositions were stored at 20° C. in the air. The results of evaluation are shown in TABLE 4 together with the results of evaluation of the photosensitive paste composition in Example 1. The mark "○" in TABLE 4 denotes that the paste compositions were not gelled and coating was possible. The mark "x" denotes, on the other hand, that the paste compositions were gelled and coating was impossible.

TABLE 4

| EX-AM-PLE | ADDITIVE | IMMEDI-ATELY AFTER | 1 DAY AFTER | 3 DAYS AFTER | 1 WEEK AFTER | 1 MONTH AFTER |
| --- | --- | --- | --- | --- | --- | --- |
| 11 | dipropylene glycol monomethyl ether | ○ | ○ | ○ | ○ | ○ |
| 17 | none | ○ | x | x | x | x |
| 18 | phosphoric acid | ○ | x | x | x | x |
| 19 | benzotriazole | ○ | x | x | x | x |
| 20 | acetic acid | ○ | x | x | x | x |

TABLE 4 shows that, while stabilities of the photosensitive paste not containing the mono-ol compounds at all and the photosensitive paste containing a gelation preventive agent was good and gelation was prevented immediately after preparation, gelation had initiated with time lapse.

EXAMPLE 21
(photosensitive paste composition)

After mixing each component having the following compositions and blending amounts, the mixture was kneaded with a three-roll mill to prepare a photosensitive paste composition.

[Organic binder]

A copolymer with a copolymerization weight ratio of methacrylic acid/methyl methacrylate of 25/75 (weight average molecular weight=50,000): 2.0 g.

[Inorganic powder]

$SiO_2$—PbO—$B_2O_3$ based glass powder (containing 17% of boric acid): 3.0g $Ru_2O$ (resistor): 2.0 g.

[Monomer containing reactive functional group]

Trimethylolpropane triacrylate: 1.0 g.

[Photo-polymerization initiator]

2-methyl-1-[4-(methylthio)phenyl]-2-morpholinopropane-1-one: 0.4 g 2,4-diethylthioxanthone: 0.1 g.

[Organic solvent]

Ethylcarbitol acetate: 4.0 g.

[Mono-ol compound]

Dipropyleneglycol monomethyl ether (boiling point 189 to 190° C.): 1.0 g.

[UV absorbing agent]

Azo red dye: 0.1 g.

Then, the photosensitive paste composition in this example was coated on an alumina insulating substrate by spin coating and dried at 100° C. for 1 hour to form a coating film with a thickness of 20 μm. After allowing the coating film obtained to stand for 24 hours, the film was exposed to a high-pressure mercury lamp at a luminous energy of 250 mJ/cm$^2$ through a mask on which a square with a side length of 30 μm was printed. Cubic bodies with a dimension of 30×30×30 μm were obtained by development with an aqueous sodium carbonate solution. Cubic resistors with a dimension of 20×20×20 μm were obtained by firing at 850° C. in air. The electric resistance of these resistors was measured to be 16 kW.

Preservation states of the photosensitive paste composition was observed at a temperature of 20° C. in the air immediately after preparation and 1 day, three days, one week and one month after the preparation, showing no gelation at any time. In other words, it was possible to coat the paste composition on the insulating substrate using a spin coater and to construct the cubic bodies by photolithography immediately after the preparation as well as even at 1 day, three days, one week and one month after the preparation.

EXAMPLE 22
(photosensitive paste composition)

A photosensitive paste composition was prepared by the same method as in Example 21, except that 2-octyl alcohol (boiling point 178 to 179° C.) was used in place of dipropyleneglycol monomethyl ether.

EXAMPLE 23
(photosensitive paste composition)

A photosensitive paste composition was prepared by the same method as in Example 21, except that butyl lactate (boiling point 185 to 187° C.) was used in place of dipropyleneglycol monomethyl ether.

EXAMPLE 24
(photosensitive paste composition)

A photosensitive paste composition was prepared by the same method as in Example 21, except that 3-methoxy-3-methylbutanol (boiling point 173 to 175° C.) was used in place of dipropyleneglycol monomethyl ether.

EXAMPLE 25
(photosensitive paste composition)

A photosensitive paste composition was prepared by the same method as in Example 21, except that 4-methylcyclohexanol (boiling point 172 to 175° C.) was used in place of dipropyleneglycol monomethyl ether.

EXAMPLE 26
(photosensitive paste composition)

A photosensitive paste composition was prepared by the same method as in Example 21, except that 1-heptyl alcohol (boiling point 176° C.) was used in place of dipropyleneglycol monomethyl ether.

Cubic bodies with a dimension of 30×30×30 μm were formed on the alumina insulating substrate by the same method as in Example 21 using the photosensitive compositions in Examples 22 to 26. Stabilities during development process were evaluated with respect to the coating films with the photosensitive compositions in Examples 22 to 26. The results of evaluation are shown in TABLE 5 below. The mark "○" in TABLE 5 denotes that the non-exposed portions were dissolved into the development solution and good cubic bodies were formed. The mark "x" denotes that, although the non-exposed portions were partly dissolved into the development solution, the cubic bodies could not be sufficiently formed, while the mark "x" denotes that the non-exposed portions were not dissolved into the development solution and the cubic bodies could not be formed.

TABLE 5

| EXAMPLE | MONO-OL COMPOUND | BOILING POINT | RESULT |
|---|---|---|---|
| 21 | dipropylene glycol monomethyl ether | 189–190° C. | ○ |
| 22 | 2-octyl alcohol | 178–179° C. | ○ |
| 23 | butyl lactate | 185–187° C. | ○ |
| 24 | 3-methoxy-3-methyl butanol | 173–175° C. | x |
| 25 | 4-methylcyclohexanol | 172–175° C. | x |
| 26 | 1-heptyl alcohol | 176° C. | Δ |

TABLE 5 shows that the non-exposed portions were readily dissolved into the development solution in the photosensitive paste composition in Examples 21 to 23 containing the mono-ol compounds with a boiling point of about 178° C. or more, and the cubic bodies with good configurations could be formed.

To the contrary, the mono-ol compounds were evaporated off during the drying step after coating the photosensitive paste compositions when the mono-ol compounds with a boiling point of less than about 178° C. were used as in Examples 24 to 26, and gelation preventive ability was deteriorated.

EXAMPLE 27
(photosensitive paste composition)

A photosensitive paste composition was prepared by the same method as in Example 21, except that dipropyleneglycol monomethyl ether was not added.

EXAMPLE 28
(photosensitive paste composition)

A photosensitive paste composition was prepared by the same method as in Example 21, except that 0.1 g of phosphoric acid was added in place of 1.0 g of dipropyleneglycol monomethyl ether.

EXAMPLE 29
(photosensitive paste composition)

A photosensitive paste composition was prepared by the same method as in Example 21, except that 0.02 g of benzotriazole was added in place of 1.0 g of dipropyleneglycol monomethyl ether.

EXAMPLE 30
(photosensitive paste composition)

A photosensitive paste composition was prepared by the same method as in Example 21, except that 1.0 g of acetic acid was added in place of 1.0 g of dipropyleneglycol monomethyl ether.

Preservation stabilities of the photosensitive paste compositions in Examples 27 to 30 were evaluated. The photosensitive paste compositions were stored at 20° C. in the air. The results of evaluation are shown in TABLE 6 together with the evaluation result of the photosensitive paste composition in Example 21. The marks "○" in TABLE 6 denotes that the paste compositions were not gelled and coating was possible, while the mark "x" denotes that the paste compositions were gelled and coating was impossible.

TABLE 6

| EXAMPLE | ADDITIVE | IMMEDIATELY AFTER | 1 DAY AFTER | 3 DAYS AFTER | 1 WEEK AFTER | 1 MONTH AFTER |
|---|---|---|---|---|---|---|
| 21 | dipropylene glycol monomethyl ether | ○ | ○ | ○ | ○ | ○ |
| 27 | none | ○ | x | x | x | x |
| 28 | phosphoric acid | ○ | x | x | x | x |
| 29 | benzotriazole | ○ | x | x | x | x |
| 30 | acetic acid | ○ | x | x | x | x |

TABLE 6 shows that, although the photosensitive paste composition not containing the mono-ol compounds at all and the photosensitive paste compositions containing gelation preventive agents other than propylene glycol monomethyl ether showed good stability by preventing gelation, they started to gel after a time lapse.

Examples 1 to 30 show that gelation can be well suppressed in the paste before coating and after coating and drying when the paste composition contains the mono-ol compounds with a boiling point of about 178° C. or more. It was made clear that very fine patterns and via-holes can be formed with high precision since preservation stability is improved while enabling stable development process by the photolithographic method.

EXAMPLE 31
(photosensitive paste composition)

A photosensitive paste was prepared by the same method as in Example 1, except that the UV absorbing agent was not added.

After forming a coating film with a thickness of 20 µm on the insulating alumina substrate by the same method as in Example 1, the film was exposed to a high-pressure mercury lamp at a luminous energy of 250 mJ/cm² through a mask on which a pattern with a line/space (L/S) ratio of 20/20 (µm) was printed. Then, the exposed pattern was developed with an aqueous solution of sodium carbonate.

The result showed that portions insoluble in the development solution appeared, showing a tendency that the pattern with a L/S ratio of 20/20 (µm) had been disturbed to some extent.

EXAMPLE 32
(photosensitive paste composition)

After mixing each component having the following compositions and blending amounts, the mixture was kneaded with a three-roll mill to prepare a photosensitive paste composition.

[Organic binder]
A copolymer with a copolymerization weight ratio of methacrylic acid/methyl methacrylate of 25/75 (weight average molecular weight=50,000): 2.0 g.

[Inorganic powder]
$SiO_2$—$K_2O$—$B_2O_3$ based glass powder (density 2.9 g/cm³): 5.0 g.

[Monomer containing reactive functional group]
Trimethylolpropane triacrylate: 1.0 g.

[Photo-polymerization initiator]
2-methyl-1-[4-(methylthio)phenyl]-2-morpholinopropane-1-one: 0.4 g  2,4-diethylthioxanthone: 0.1 g.

[Organic solvent]
Ethylcarbitol acetate: 4.0 g.

[Mono-ol compound]
Dipropyleneglycol monomethyl ether (boiling point 189 to 190° C.): 1.0 g.

[UV absorbing agent]
Azo red dye: 0.1 g.

The volume fraction (abbreviated as Vol % hereinafter) of the inorganic powder in the photosensitive paste composition after firing was 34% in this example.

The photosensitive paste composition was coated on the insulating alumina substrate and dried at 100° C. for 1 hour to obtain a coating film with a thickness of 20 µm. After being allowed to stand for 24 hours, the film was exposed to a high-pressure mercury lamp at a luminous energy of 250 mJ/cm² through a mask on which a pattern with a line/space (L/S) ratio of 20/20 (µm) was printed. Then, the exposed pattern was developed with an aqueous solution of sodium carbonate, obtaining a pattern with a line/space (L/S) ratio of 20/20 (µm). An insulator pattern with a L/S ratio of 10/30 (µm) was obtained by firing at 850 ° C. in the air.

Preservation states of the photosensitive paste composition was observed at a temperature of 20° C. in the air immediately after preparation and at 1 day, 3 days, 1 week and 1 month after preparation. The photosensitive paste composition showed no sign of gelation at any time of preservation. In other words, it was possible to coat the paste composition on the insulating substrate comprising alumina using a spin coater and to form a pattern by photolithography immediately after the preparation as well as even at 1 day, three days, one week and one month after the preparation.

EXAMPLE 33
(photosensitive paste composition)

A photosensitive paste composition was prepared by the same method as in Example 32, except that the amount of blending of the inorganic powder was adjusted to 30% by volume.

EXAMPLE 34
(photosensitive paste composition)

A photosensitive paste composition was prepared by the same method as in Example 32, except that the amount of blending of the inorganic powder was adjusted to 29% by volume.

EXAMPLE 35
(photosensitive paste composition)

A photosensitive paste composition was prepared by the same method as in Example 32, except that the amount of blending of the inorganic powder was adjusted to 28% by volume.

Insulator patterns with a L/S ratio of 10/30 (µm) were formed on the insulating alumina substrate by the same method as in Example 32 using the photosensitive paste compositions in Examples 33 to 35. The coating films formed by using the photosensitive paste compositions in Examples 33 to 35 were evaluated with respect to breakdown of wiring . The results of evaluation are shown in TABLE 7. The mark "○" in TABLE 7 indicates that a good pattern could be formed without any breakdown in the firing step. The mark "Δ" in TABLE 7 indicates that breakdown of wiring was observed at one to five points per cm of the line. The mark "x" in TABLE 7 indicates that breakdown of wiring was observed at more than five points per cm of the line.

TABLE 7

| EXAMPLE | VOL % | RESULT |
|---------|-------|--------|
| 32 | 34% | ○ |
| 33 | 30% | ○ |
| 34 | 29% | Δ |
| 35 | 28% | x |

TABLE 7 shows that the insulator patterns having good processing perfomance without any breakdown of wiring in the firing step could be obtained as shown in Examples 32 and 33 by using the photosensitive paste compositions containing about 30% by volume or more of the inorganic powder that remains after firing.

On the contrary, the insulator patters could be hardly formed due to breakdown of wiring in the firing step as shown in Examples 34 and 35 when less than about 30% by volume of the inorganic powder remains after firing.

EXAMPLE 36
(photosensitive paste composition)

A photosensitive paste composition was prepared by the same method as in Example 32, except that the amount of the $SiO_2$—$K_2$—$B_2O_3$ based glass powder (density 2.9 g/cm$^3$)) was changed to 76.7 g. The volume ratio of the inorganic powder remaining after firing (800° C.) in the photosensitive paste composition in this example was 89%.

The photosensitive paste composition was coated on the insulating alumina substrate by spin coating and dried at 100° C. for 1 hour to obtain a coating film with a thickness of 20 μm. After standing for 24 hours, the film was exposed to a high-pressure mercury lamp at a luminous energy of 250 mJ/Cm$^2$ through a mask on which a pattern with a line/space (L/S) ratio of 20/20 (μm) was printed. Then, the exposed pattern was developed with an aqueous solution of sodium carbonate, obtaining a pattern with a line/space (L/S) ratio of 20/20 (μm). An insulator pattern with a L/S ratio of 20/20 (μm) was obtained by firing at 850° C. in the air.

Preservation states of the photosensitive paste composition was observed at a temperature of 20° C. in the air immediately after preparation, and at 1 day, three days, one week and one month after the preparation. The photosensitive paste composition showed no sign of gelation at any time of preservation. In other words, it was possible to coat the paste composition on the insulating substrate comprising alumina using a spin coater and to form a pattern by photolithography immediately after the preparation as well as even at 1 day, three days, one week and one month after the preparation.

EXAMPLE 37
(photosensitive paste composition)

A photosensitive paste composition was prepared by the same method as in Example 36, except that the amount of mixing of the inorganic powder was changed to be 90% by volume.

EXAMPLE 38
(photosensitive paste composition)

A photosensitive paste composition was prepared by the same method as in Example 36, except that the amount of mixing of the inorganic powder was changed to be 91% by volume.

Patterns with a L/S ratio of 20/30 (μm) of the photosensitive paste compositions in Examples 37 and 38 were formed by the same method as in Example 36 using. The coating films formed by using the photosensitive paste compositions in Examples 36 to 38 were evaluated with respect to development performance. The results of evaluation are shown in TABLE 8. The mark "○" in TABLE 8 indicates that a good pattern could be formed without any breakdown of the coating film in the development step. The mark "Δ" in TABLE 8 indicates that good patterns could not be formed due to partial breakdown of the coating film in the development step. The mark "x" in TABLE 8 indicates that pattern could be hardly formed because the coating film was broken over the entire surface of the substrate in the development step.

TABLE 8

| EXAMPLE | VOL % | RESULT |
|---------|-------|--------|
| 36 | 89% | ○ |
| 37 | 90% | Δ |
| 38 | 91% | x |

TABLE 8 shows that good patterns could be formed without breakdown of the coating film at all, when the amount of the inorganic powder remaining after firing is less than about 90% by volume as shown in the photosensitive paste composition in Example 36.

On the contrary, patterns could not be formed by breakdown of some of the coating films in the development step, when the amount of the inorganic powder remaining in the photosensitive paste composition after firing is about 90% by volume or more as in Examples 37 and 38.

EXAMPLE 39
(photosensitive paste composition)

After mixing each component having the following compositions and blending amounts, the mixture was kneaded with a three-roll mill to prepare a photosensitive paste composition.

[Organic binder]
A copolymer with a copolymerization weight ratio of methacrylic acid/methyl methacrylate of 25/75 (weight average molecular weight=50,000): 2.0 g.

[Inorganic powder]
$SiO_2$—$K_2O$—$B_2O_3$ based glass powder (mean particle size 0.2 μm): 5.0 g

[Monomer containing reactive functional group]
Trimethylolpropane triacrylate: 1.0 g.

[Photo-polymerization initiator]
2-methyl-1-[4-(methylthio)phenyl]-2-morpholinopropane-1-one: 0.4 g 2,4-diethylthioxanthone: 0.1 g.

[Organic solvent]
Ethylcarbitol acetate: 4.0 g.

[Mono-ol compound]
Dipropyleneglycol monomethyl ether (boiling point 189 to 190° C.): 1.0 g.

[UV absorbing agent]
Azo red dye: 0.1 g.

The photosensitive paste composition was coated on the insulating alumina substrate and dried at 100° C. For 1 hour to obtain a coating film with a thickness of 20 μm. After allowing the coating film obtained to stand for 24 hours, the film was exposed to a high-pressure mercury lamp at a luminous energy of 250 mJ/cm$^2$ through a mask. on which a pattern with a line/space (L/S) ratio of 20/20 (μm) was printed. Then, the exposed pattern was developed with an aqueous solution of sodium carbonate, obtaining a pattern with a line/space (L/S) ratio of 20/20 (μm). An insulator pattern with a L/S ratio of 8/32 (μm) was obtained by firing at 850° C. in the air.

Preservation states of the photosensitive paste composition was observed at a temperature of 20° C. in the air immediately after preparation and at 1 day, three days, one week and three months after the preparation. The photosensitive paste composition in this example showed no sign of gelation at any time of preservation. In other words, it was possible to coat the paste composition on the insulating substrate comprising alumina using a spin coater and to form a pattern by photolithography immediately after the preparation as well as even at 1 day, three days, one week and one month after the preparation.

EXAMPLE 40
(photosensitive paste composition)

A photosensitive paste composition was prepared by the same method as in Example 39, except that the mean particle size of the $SiO_2$—$K_2O$—$B_2O_3$ based glass powder was changed to 0.1 $\mu$m.

EXAMPLE 41
(photosensitive paste composition)

A photosensitive paste composition was prepared by the same method as in Example 39, except that the mean particle size of the $SiO_2$—$K_2O$—$B_2O_3$ based glass powder was changed to 0.07 $\mu$m.

EXAMPLE 42
(photosensitive paste composition)

A photosensitive paste composition was prepared by the same method as in Example 39, except that the mean particle size of the $SiO_2$—$K_2O$—$B_2O_3$ based glass powder was changed to 0.04 $\mu$m.

Patterns with a L/S ratio of 20/20 ($\mu$m) were formed using the photosensitive paste compositions in Examples 40 to 42 by the same method as in Example 39. Luminous energy required for exposure was measured with respect to the coating films in the Examples 39 to 42. The results of measurements are shown in TABLE 9.

TABLE 9

| EXAMPLE | MEAN PARTICLE SIZE | REQUIRED LUMINOUS ENERGY FOR EXPOSURE |
| --- | --- | --- |
| 39 | 0.2 $\mu$m | 400 mJ/cm$^2$ |
| 40 | 0.1 $\mu$m | 450 mJ/cm$^2$ |
| 41 | 0.07 $\mu$m | 2500 mJ/cm$^2$ |
| 42 | 0.04 $\mu$m | >5000 mJ/cm$^2$ |

The required luminous energy for exposure was less than 500 mJ/cm$^2$ when the mean particle size of the glass particles is about 0.1 $\mu$m or more as in the photosensitive paste compositions in Examples 39 and 40, indicating that patterns with good configurations could be efficiently formed.

On the contrary, the required luminous energy for exposure was extremely increased when the mean particle size of the glass particles is less than about 0.1 $\mu$m as in Examples 41 and 42, making it difficult to efficiently form the patterns.

EXAMPLE 43
(photosensitive paste composition)

A photosensitive paste composition was prepared by the same method as in Example 39, except that the mean grain size of the $SiO_2$—$K_2O$—$B_2O_3$ based glass powder was changed to 9 $\mu$m.

EXAMPLE 44
(photosensitive paste composition)

A photosensitive paste composition was prepared by the same method as in Example 39, except that the mean grain size of the $SiO_2$—$K_2O$—$B_2O_3$ based glass powder was changed to 10 $\mu$m.

EXAMPLE 45
(photosensitive paste composition)

A photosensitive paste composition was prepared by the same method as in Example 39, except that the mean grain size of the $SiO_2$—$K_2O$—$B_2O_3$ based glass powder was changed to 11 $\mu$m.

Patterns with a L/S ratio of 20/20 ($\mu$m) were formed using the photosensitive paste compositions in Examples 43 to 45 by the same method as in Example 39. Development performance of the coating films using the photosensitive paste compositions in Examples 43 to 45 were evaluated. The results of the evaluation are shown in TABLE 10. The mark "○" in TABLE 10 shows that good patterns could be formed without connection among the lines due to coarse particles in the development process. The mark "Δ" in TABLE 10 shows that good patterns could not be formed since the lines are partly connected in the development process due to coarse particles. The mark "x" means that patterns could be hardly formed because the lines are entirely connected in the development process due to coarse particles.

TABLE 10

| EXAMPLE | MEAN PARTICLE SIZE | RESULT |
| --- | --- | --- |
| 43 | 9 $\mu$m | ○ |
| 44 | 10 $\mu$m | Δ |
| 45 | 11 $\mu$m | x |

TABLE 10 shows that good patterns could be formed without any connection due to coarse particles among the lines in the development process when the mean particle size of the glass powder is less than 9 $\mu$m as in the photosensitive paste composition in Example 43.

On the contrary, patterns were liable to be hardly formed when the mean particle size of the glass powder is 10 $\mu$m or more as in Examples 44 and 45, because lines are connected with one another during the development process due to coarse particles.

EXAMPLE 46
(circuit board)

A slurry, obtained by mixing 37.3 g of the borosilicate glass, 24.9 g of the alumina powder, 6.2 g of the copolymer (weight average molecular weight=50,000) of methacrylic acid and methyl methacrylate in a weight ratio of 25/75, 3.1 g of ethanol and 0.5 g of dipropyleneglycol monomethyl ether, was formed into a sheet by the doctor blade method. The sheet of the slurry was dried at 100° C. for 1 hour to obtain a ceramic green sheet with a thickness of 30 $\mu$m.

Cubic bodies with a dimension of 30×30×30 $\mu$m were formed on a PET film by the same method as in Example 21 using the photosensitive paste composition in Example 21. Then, the PET film on which the cubic bodies were formed was laid over the ceramic green sheet. The pair of the film and sheet was hot-pressed at 60° C. under a pressure of 10 MPa, thereby heat-transferring the cubic bodies on the green sheet by peeling them off from the PET film. The green sheet was fired at 900° C. in the air, obtaining an alumina substrate on which resistors with a dimension of 20×20×20 $\mu$m were formed.

EXAMPLE 47

(circuit board)

Five ceramic green sheets on which cubic bodies were formed were manufactured by the same method in Example 46. These ceramic green sheets were laminated and hot-pressed at 60° C. for 1 minute. The laminated green sheets were fired at 900° C. in the air, obtaining an alumina multilayer substrate in which 16 kW resistors with a dimension of 20×20×20 μm were integrated.

EXAMPLE 48

(circuit board)

The ceramic slurry shown in Example 46 was coated by the doctor blade method on the PET film on which cubic bodies were formed shown as in Example 46. After drying at 50° C. for 1 hour, the PET film was hot-pressed at 50° C. for 1 minute under a pressure of 10 MPa to peel the PET film off from the ceramic layer. The ceramic layer was fired at 900° C. in the air to obtain an alumina multilayer substrate on which 16 kW resistors with a dimension of 20×20×20 μm were formed.

EXAMPLE 49

(circuit board)

After mixing 10.0 g of the borosilicate glass powder, 10.0 g of the copolymer (weight average molecular weight=50,000) of methacrylic acid and methyl methacrylate in a weight ratio of 25/75, and 0.5 g of dipropyleneglycol monomethyl ether, the mixture was kneaded with a three-roll mill to prepare a paste composition.

A coating film having holes for via-holes was formed on the alumina insulating substrate using the paste composition by the screen printing method. After filling the holes for the via-holes with a conductive paste, the film was dried at 100° C. for 1 hour to form an insulating layer with a diameter of 30 μm having the via-holes with a diameter of 200 μm. The insulation layer was fired at 850° C. in the air, obtaining an insulating layer with a thickness of 20 μm having the via-holes with a diameter of 250 μm.

Preservation states of the paste composition in this example was observed immediately after preparation, and one day, three days, one week and one month after the preparation. The results showed that the paste composition in this example was not gelled at any time after the preparation. In other words, coating film could be formed on the substrate by the screen printing method immediately after preparation, as well as one day, three days, one week and one month after the preparation.

EXAMPLE 50

(insulating ceramic green sheet)

A slurry obtained by mixing 37.3 g of a borosilicate glass powder, 24.9 g of an alumina powder, 6.2 g of an acrylic organic binder containing carboxyl groups, 3.1 g of ethanol, and 0.5 g of dipropyleneglycol monomethyl ether was formed into a sheet by the doctor blade method. The sheet was dried at 100° C. to obtain an insulating ceramic green sheet with a thickness of 30 μm.

EXAMPLE 51

(dielectric green sheet)

A slurry obtained by mixing 6.2 g of a borosilicate glass powder, 56.0 g of barium titanate, 6.2 g of an acrylic organic binder containing carboxyl groups, 3.1 g of ethanol and 0.5 g of dipropyleneglycol monomethyl ether was formed into a sheet by the doctor blade method. The sheet was dried at 100° C. to obtain a dielectric ceramic green sheet with a thickness of 30 μm.

EXAMPLE 52

(magnetic ceramic green sheet)

A slurry obtained by mixing 6.2 g of a borosilicate glass powder, 56.0 g of nickel-zinc ferrite, 6.2 g of an acrylic organic binder containing hydroxyl groups, 3.1 g of ethanol and 0.5 g of dipropyleneglycol monomethyl ether was formed into a sheet by the doctor blade method. The sheet was dried at 100° C. to obtain a magnetic ceramic green sheet with a thickness of 30 μm.

COMPARATIVE EXAMPLE 1

(insulating ceramic green sheet)

A slurry prepared by the same method as in example 51, except that dipropyleneglycol monomethyl ether was not mixed, was formed into a sheet. The sheet was dried at 100° C. to obtain an insulating ceramic green sheet with a thickness of 30 μm.

COMPARATIVE EXAMPLE 2

(dielectric ceramic green sheet)

A slurry prepared by the same method as in example 52, except that dipropyleneglycol monomethyl ether was not mixed, was formed into a sheet. The sheet was dried at 100° C. to obtain a dielectric ceramic green sheet with a thickness of 30 μm.

COMPARATIVE EXAMPLE 3

(magnetic ceramic green sheet)

A slurry prepared by the same method as in example 53, except that dipropyleneglycol monomethyl ether was not mixed, was formed into a sheet. The sheet was dried at 100° C. to obtain a magnetic ceramic green sheet with a thickness of 30 μm.

After degreasing the ceramic green sheets obtained in Examples 50 to 52 and comparative examples 1 to 3, they were fired at 900° C. in the air. Bend strengths and densities of the ceramic substrates (after sintering) were measured. The results are shown in TABLE 11.

TABLE 11

(ceramic green sheet)

|  | APPLI-CATION | DIPROPYLENE GLYCOL MONOMETHYL ETHER | BENDING STRENGTH (MPa) | DENSITY (g/cm) |
|---|---|---|---|---|
| EXAMPLE 50 | INSULATING MEMBER | 0.5 g | 260 | 3.10 |
| EXAMPLE 51 | DIELECTRIC MEMBER | 0.5 g | 180 | 5.80 |
| EXAMPLE 52 | MAGNETIC MEMBER | 0.5 g | 150 | 5.85 |
| COMPARATIVE EXAMPLE 1 | INSULATING MEMBER | — | 220 | 2.95 |
| COMPARATIVE EXAMPLE 2 | DIELECTRIC MEMBER | — | 150 | 5.67 |
| COMPARATIVE EXAMPLE 3 | MAGNETIC MEMBER | — | 110 | 5.55 |

It is evident from TABLE 11 that the insulating ceramic green sheet, dielectric ceramic green sheet and magnetic ceramic green sheet according to the present invention have excellent substrate characteristics in that they are fairly balanced in bending strength and density besides having high strength.

On the contrary, the ceramic green sheets in the comparative examples contain no mono-ol compound such as dipropyleneglycol monomethyl ester. Therefore, the bending strength is reduced or the density of the sintered substrate is small, indicating that the slurry for the ceramic green sheet became nonuniform due to gelation.

EXAMPLE 53
(photosensitive insulating ceramic green sheet)

A slurry obtained by mixing 37.7 g of a borosilicate glass powder, 24.9 g of alumina powder, 6.2 g of an acrylic organic binder containing hydroxyl groups, 3.1 g of ethanol, 3.0 g of trimethylolpropane triacrylate, 1.2 g of 2-methyl-1-[4-(methylthio)phenyl]2-morphorinopropane-1-on, 0.3 g of 2,4-diethylthioxanthone and 0.5 g of dipropyleneglycol monomethyl ether was formed into a sheet by the doctor blade method. The sheet was dried at 100° C. to obtain a photosensitive insulating ceramic green sheet with a thickness of 30 μm.

EXAMPLE 54
(photosensitive dielectric ceramic green sheet)

A slurry obtained by mixing 6.2 g of a borosilicate glass powder, 56.0 g of barium titanate, 6.2 g of an acrylic organic binder containing hydroxyl groups, 3.1 g of ethanol, 3.0 g of trimethylolpropane triacrylate, 1.2 g of 2-methyl-1-[4-(methylthio)phenyl]-2-morphorinopropane-1-on, 0.3 g of 2,4-diethylthioxanthone and 0.5 g of dipropyleneglycol monomethyl ether was formed into a sheet by the doctor blade method. The sheet was dried at 100° C. to obtain a photosensitive dielectric ceramic green sheet with a thickness of 30 μm.

EXAMPLE 55
(photosensitive magnetic ceramic green sheet)

A slurry obtained by mixing 6.2 g of a borosilicate glass powder, 56.0 g of nickel-zinc ferrite, 6.2 g of an acrylic organic binder containing hydroxyl groups, 3.1 g of ethanol, 3.0 g of trimethylolpropane triacrylate, 1.2 g of 2-methyl-1-[4-(methylthio)phenyl]-2-morphorinopropane-1-on, 0.3 g of 2,4-diethylthioxanthone and 0.5 g of dipropyleneglycol monomethyl ether was formed into a sheet by the doctor blade method. The sheet was dried at 100° C. to obtain a photosensitive magnetic ceramic green sheet with a thickness of 30 μm.

COMPARATIVE EXAMPLE 4
(photosensitive insulating ceramic green sheet)

A slurry was formed into a sheet by the same method as in Example 53 using the doctor blade method, except that dipropyleneglycol monomethylether was not mixed. The sheet was dried at 100° C. to obtain a photosensitive insulating ceramic green sheet with a thickness of 30 μm.

COMPARATIVE EXAMPLE 5
(photosensitive dielectric ceramic green sheet)

A slurry was formed into a sheet by the same method as in Example 54 using the doctor blade method, except that dipropyleneglycol monomethylether was not mixed. The sheet was dried at 100° C. to obtain a photosensitive dielectric ceramic green sheet with a thickness of 30 μm.

COMPARATIVE EXAMPLE 6
(photosensitive magnetic ceramic green sheet)

A slurry was formed into a sheet by the same method as in Example 55 using the doctor blade method, except that no dipropyleneglycol monomethylether was not mixed. The sheet was dried at 100° C. to obtain a photosensitive magnetic ceramic green sheet with a thickness of 30 μm.

A light beam from a high pressure mercury lamp with a luminous energy of 250 mJ/cm$^2$ was irradiated to each ceramic green sheet formed in Examples 53 to 55 and Comparative Examples 4 to 6 through a mask on which a via-hole with a diameter of 30 μm was printed. Holes for the via-holes with a diameter of 30 μm were then formed by developing with an aqueous sodium carbonate solution. After filling a conductor material into this hole for the via-hole, the substrate was degreased and dried at 900° C. in the air. Bending strength and density of the ceramic substrate was measured after sintering. The results are shown in TABLE 12.

TABLE 12

(photosensitive ceramic green sheet)

| | APPLICATION | DIPROPYLENE GLYCOL MONOMETHYL ETHER | BENDING STRENGTH (MPa) | DENSITY (g/cm) |
|---|---|---|---|---|
| EXAMPLE 53 | INSULATING MEMBER | 0.5 g | 250 | 3.10 |
| EXAMPLE 54 | DIELECTRIC MEMBER | 0.5 g | 160 | 5.80 |
| EXAMPLE 55 | MAGNETIC MEMBER | 0.5 g | 140 | 5.85 |
| COMPARATIVE EXAMPLE 4 | INSULATING MEMBER | — | 190 | 2.95 |
| COMPARATIVE EXAMPLE 5 | DIELECTRIC MEMBER | — | 100 | 5.67 |
| COMPARATIVE EXAMPLE 6 | MAGNETIC MEMBER | — | 90 | 5.55 |

Table 12 shows that all the insulating ceramic green sheet, dielectric ceramic green sheet and ceramic green sheet according to the present invention are fairly balanced in bending strength and density besides having high strength and excellent substrate characteristics. Performance for forming the via-holes was also excellent.

On the contrary, the ceramic green sheet according to the comparative examples had low bending strength or low substrate density after sintering because they did not contain any mono-ol compounds such as dipropyleneglycol monomethyl ether. In addition, performance for forming the via-holes was poor, suggesting that dispersing property was decreased, or non-uniformly dispersed, due to gelation of the slurry for the ceramic green sheet.

As hitherto described, including the mono-ol compound having a boiling point of 178° C. or more in the slurry for the ceramic green sheet prevents gelation from advancing and enables a uniform slurry to be obtained. Accordingly, the ceramic green sheet prepared from such slurry have good processing performance for the via-holes and semiconductor patterns while being free from crack generation after sintering, consequently giving a mechanically tough ceramic substrate.

While the invention has been particularly shown and described with reference to preferred embodiments thereof, it will be understood by those skilled in the art that the forgoing and other changes in form and details may be made therein without departing from the spirit of the invention.

What is claimed is:

1. A paste composition comprising:
   (A) an organic binder comprising acidic functional groups;

(B) an inorganic powder comprising a multivalent metal compound; and (C) a mono-ol compound having a boiling point of about 178° C. or more.

2. The paste composition according to claim 1, wherein the inorganic powder comprises a glass powder or ceramic powder or both.

3. The paste composition according to claim 2, wherein the paste composition contains about 30% to less than about 90% by volume of the inorganic powder.

4. The paste composition according to claim 3, wherein the mean particle size of the inorganic powder is in the range of about 0.1 to 10 $\mu$m.

5. The paste composition according to claim 1 additionally containing a photosensitive organic component.

6. The paste composition according to claim 5, further containing a UV absorbing agent.

7. The paste composition according to claim 1 additionally containing an organic solvent and wherein the mono-ol compound is about 10 to 92% by weight of the combined amount of the mono-ol compound and organic solvent.

8. The paste composition according to claim 7 containing at least twice as many moles of the mono-ol compound as the moles of the multivalent metal ions that are dissolved in the soluble fraction of the paste.

9. The paste composition according to claim 7, wherein the organic binder is an acrylic copolymer having carboxylic groups on its side chain.

10. The paste composition according to claim 1 additionally containing an organic solvent, wherein the mono-ol compound is about 10 to 92% by weight of the combined amount of the mono-ol compound and organic solvent and wherein the paste composition contains about 30% to less than about 90% by volume of the inorganic powder.

11. The paste composition according to claim 10 containing at least twice as many moles of the mono-ol compound as the moles of the multivalent metal ions that are dissolved in the soluble fraction of the paste.

12. A ceramic green sheet comprising a sheet of a slurry comprising a solvent and the paste composition of claim 1.

13. The ceramic green sheet according to claim 12 containing at least twice the number of moles of the mono-ol compound as the moles of the multivalent metal ions that are dissolved in the solvent fraction of the slurry.

14. The ceramic green sheet according to claim 13, wherein the content of the mono-ol compound is about 5 to 95% by weight relative to the total solvent fraction of the slurry.

15. The ceramic green sheet according to claim 12, wherein the content of the mono-ol compound is about 5 to 95% by weight relative to the total solvent fraction of the slurry.

16. The ceramic green sheet according to claim 15, wherein the inorganic powder is a powder containing at least one multivalent ion selected from the group comprising boron, barium, magnesium, aluminum, calcium, lead, bismuth, copper, zinc, zirconium, niobium, chromium, strontium and titanium.

17. The ceramic green sheet according to claim 12, wherein the slurry further comprises a photosensitive organic component.

18. A method for manufacturing a ceramic multilayer substrate comprising the steps of: forming via-holes through a plurality of ceramic green sheets of claim 12; forming a conductor pattern in electrical continuity with a via-hole on at least one of the resulting green sheets; laminating a plurality of the via-hole containing green sheets including the ceramic green sheet having the conductor pattern; and firing the laminated green sheets.

* * * * *